US009666536B2

(12) United States Patent
Liu et al.

(10) Patent No.: US 9,666,536 B2
(45) Date of Patent: May 30, 2017

(54) PACKAGE STRUCTURE AND FABRICATION METHOD THEREOF

(71) Applicant: Siliconware Precision Industries Co., Ltd., Taichung (TW)

(72) Inventors: Yi-Wei Liu, Taichung (TW); Yan-Heng Chen, Taichung (TW); Mao-Hua Yeh, Taichung (TW); Hung-Wen Liu, Taichung (TW); Yi-Che Lai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/956,758

(22) Filed: Dec. 2, 2015

(65) Prior Publication Data

US 2016/0190099 A1 Jun. 30, 2016

(30) Foreign Application Priority Data

Dec. 27, 2014 (TW) .............................. 103145895 A

(51) Int. Cl.
*H01L 21/4763* (2006.01)
*H01L 23/538* (2006.01)
(Continued)

(52) U.S. Cl.
CPC .... *H01L 23/5386* (2013.01); *H01L 21/31053* (2013.01); *H01L 21/568* (2013.01); *H01L 21/6835* (2013.01); *H01L 21/78* (2013.01); *H01L 23/49811* (2013.01); *H01L 23/49827* (2013.01); *H01L 24/19* (2013.01); *H01L 24/20* (2013.01); *H01L 21/486* (2013.01);
(Continued)

(58) Field of Classification Search
CPC ............... H01L 23/5389; H01L 21/568; H01L 21/6835; H01L 23/5384; H01L 21/78; H01L 23/5386; H01L 21/31053
USPC .......................................................... 438/629
See application file for complete search history.

(56) References Cited

U.S. PATENT DOCUMENTS 7,791,203 B2 * 9/2010 Boon ................... H01L 21/4853
257/735
7,993,941 B2 * 8/2011 Huang ................ H01L 21/6835
257/690
(Continued)

*Primary Examiner* — Luan C Thai
(74) *Attorney, Agent, or Firm* — Mintz Levin Cohn Ferris Glovsky and Popeo, P.C.; Peter F. Corless; Steven M. Jensen

(57) ABSTRACT

The present invention provides a package structure and fabrication method thereof. The method includes providing a first carrier having a metal layer; forming a dielectric layer on the metal layer; forming a plurality of conductive pillars embedded into the dielectric layer and protruding from a surface of the dielectric layer, and disposing an electronic component on the surface of the dielectric layer; forming an encapsulating layer on the dielectric layer to encompass the plurality of conductive pillars, the dielectric layer and the electronic component; removing a portion of the encapsulating layer and the first carrier such that two ends of each of the plurality of conductive pillars are exposed from the encapsulating layer and the dielectric layer. Therefore, the present invention effectively reduces manufacturing costs and the need for an opening process while manufacturing the conductive pillars can be eliminated.

12 Claims, 5 Drawing Sheets

(51) Int. Cl.
*H01L 21/683* (2006.01)
*H01L 21/56* (2006.01)
*H01L 21/78* (2006.01)
*H01L 21/3105* (2006.01)
*H01L 23/498* (2006.01)
*H01L 21/48* (2006.01)
*H01L 25/00* (2006.01)
*H01L 23/00* (2006.01)
*H01L 25/10* (2006.01)

(52) U.S. Cl.
CPC ...... *H01L 23/5384* (2013.01); *H01L 23/5389* (2013.01); *H01L 24/16* (2013.01); *H01L 25/105* (2013.01); *H01L 25/50* (2013.01); *H01L 2221/68318* (2013.01); *H01L 2221/68345* (2013.01); *H01L 2221/68359* (2013.01); *H01L 2221/68372* (2013.01); *H01L 2224/12105* (2013.01); *H01L 2224/16235* (2013.01); *H01L 2225/06517* (2013.01); *H01L 2225/06548* (2013.01); *H01L 2225/1035* (2013.01); *H01L 2225/1041* (2013.01); *H01L 2225/1058* (2013.01); *H01L 2924/15311* (2013.01)

(56) References Cited

U.S. PATENT DOCUMENTS

| | | | |
|---|---|---|---|
| 8,039,303 B2* | 10/2011 | Shim, II | H01L 21/568 257/100 |
| 8,320,134 B2* | 11/2012 | Su | H01L 23/49827 174/262 |
| 8,405,213 B2* | 3/2013 | Chen | H01L 25/16 257/685 |
| 8,937,381 B1* | 1/2015 | Dunlap | H01L 23/3128 257/686 |

* cited by examiner

PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 103145895, filed Dec. 27, 2014 the entire contents of which are incorporated herein by reference.

BACKGROUND OF THE INVENTION

1. Field of the Invention

The present invention relates to package structures and fabricating methods thereof, and more particularly, to a package structure having embedded electronic components and a method of fabricating the same.

2. Description of Related Art

With the advancement in semiconductor packaging technology, various types of packages of the semiconductor device have been developed. A chip scale package (CSP) having the package size as small as or slightly larger than the chip size, is developed in order for meeting the demand of miniaturization.

Referring to FIGS. 1A-1F, a method of fabricating a conventional semiconductor package 1 is shown.

As shown in FIG. 1A, a first carrier 10a having a first adhesive layer 100a is provided, and at least one semiconductor element 11 is disposed on the first adhesive layer 100a, then an encapsulating layer 12 is formed to encapsulate the semiconductor element 11. The semiconductor element 11 has an active surface 11a bonded with the first adhesive layer 100a and an opposing none-active surface 11b having a plurality of electrode pads 110 thereon.

As shown in FIG. 1B, a polishing method is employed to remove a portion of the encapsulating layer 12, allowing the none-active surface 11b of the semiconductor element 11 to be exposed from the second surface 12b of the encapsulating layer 12. Subsequently, the first carrier 10a and the first adhesive layer 100a are removed, and a second carrier 10b having a second adhesive layer 100b is attached on the second surface 12b of the encapsulating layer 12.

As shown in FIG. 1C, a first redistribution layer (RDL) 13 is formed on the first surface 12a of the encapsulating layer 12 and the active surface 11a of the semiconductor element 11, and the first redistribution layer 13 is electrically connected with the electrode pads 110 of the semiconductor element 11.

As shown in FIG. 1D, a third carrier 10c having a third adhesive layer 100c is disposed on the first redistribution layer 13, followed by removing the second carrier 10b and the second adhesive layer 100b. After that, a plurality of vias 121 penetrating the encapsulating layer 12 are formed by laser to expose the first redistribution layer 13.

As shown in FIG. 1E, a second redistribution layer 14 is formed on the second surface 12b of the encapsulating layer 12 and in the vias 121, and is electrically connected with the first redistribution layer 13.

As shown in FIG. 1F, the third adhesive layer 100c and the third carrier 10c are removed, followed by performing a singulation process to form a plurality of conductive elements 15 such as solder balls on the first redistribution layer 13, such that the conductive elements 15 electrically connect the first redistribution layer 13 with the second redistribution layer 14.

However, according to the method of fabricating the semiconductor package 1, the vias 121 formed by laser is not only slow (especially when the number of vias is large) but also time consuming, and the residuals (such as the remaining materials of the encapsulating layer 12) left during the process of forming the vias 121 may easily accumulate at the bottom of the vias 121. Therefore, a cleaning process must be performed to clean the interior of the vias 121 before the conductive materials could be filled in the vias 121 to form the second redistribution layer 14, thereby overcomplicating the steps involved in fabrication.

Second, laser drilling to form openings may cause unevenness of the walls of the vias 121, leading to poor attachment of the conductive materials to the walls of the vias 121, causing peeling, and ultimately resulting in poor reliability for the semiconductor package 1.

Further, the laser drilling process is performed from the second surface 12b of the encapsulating layer 12, but since the encapsulating layer 12 is opaque, the laser equipment could not detect the first redistribution layer 13 under the encapsulating layer 12, and thus requires a specialized process and equipment for alignment, thereby further increasing the complexity and cost in fabrication.

Besides, the laser beam utilized in the laser drilling process would result in a problem of heat affect zone; that is, when the vias 121 are at proximity of the semiconductor element 11, the high temperature heat would damage the semiconductor element 11, and thus the vias 121 must be kept with a certain distance from the semiconductor element 11. As such, the semiconductor package 1 could not be further miniaturized, and is difficult to meet the low-profile requirement.

Meanwhile, the number of steps (at least 3) increases for bonding and removing the carrier (i.e. from the first to the third carrier 10a-10c) during the fabricating process of the semiconductor package 1, thereby overcomplicating the fabricating process, which is time consuming and the fabricating cost is also increased due to more materials required for both the carriers and the adhesive layers.

Thus, there is an urgent need for solving the problems of the prior art.

SUMMARY OF THE INVENTION

In view of the foregoing drawbacks, the present invention provides a method of fabricating a package structure, comprising: providing a first carrier having a metal layer; forming a patterned dielectric layer on the metal layer of the first carrier, and forming a plurality of openings for exposing the metal layer in the patterned dielectric layer; forming a plurality of conductive pillars having opposing first and second ends, wherein each of the conductive pillars is electrically connected with the metal layer via the first end thereof, and the second end of each of the conductive pillars protrudes from a surface of the dielectric layer; disposing at least one first electronic component on the dielectric layer; forming an encapsulating layer on the dielectric layer, for encapsulating the conductive pillars, the first electronic component and the dielectric layer; removing a portion of the encapsulating layer, for exposing the second end of each of the conductive pillars; and removing the first carrier.

The present invention further provides a package structure, comprising: a dielectric layer; an encapsulating layer formed on the dielectric layer, allowing the dielectric layer and the encapsulating layer to form an encapsulant body having opposing first and second surfaces, wherein the first surface is an outer surface of the dielectric layer, while the second surface is an outer surface of the encapsulating layer; at least one first electronic component disposed on the dielectric layer and embedded in the encapsulating layer; and a plurality of conductive pillars which are vertically embedded in the encapsulating layer and the dielectric layer, each of the conductive pillars having a first end being exposed from the first surface and an opposing second end being exposed from the second surface.

In summary, the package structure according to the present invention and the method of fabricating the same involve forming conductive pillars in the dielectric layer in advance of forming an encapsulating layer As the package structure and the fabrication method of the present invention are without the need of forming openings, not only the number of steps involved in the fabricating process is reduced but also the fabricating process is time-saving and cost-effective, with increased reliability of the package structure and reduced package size as desired. Besides, without the need to form openings, the number of steps for bonding/removing carrier is reduced, and additional laser process is also not required, thereby preventing the occurrence of heat affect area. Furthermore, it is not required to have laser alignment equipment, and in addition, the present invention provides a solution to prevent the problem of peeling of the conductive pillars from occurrence, such that the fabricating process is made simplified with reduced cost.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "first", "second", "surface", and etc., are merely for illustrative purpose and should not be construed to limit the scope of the present invention.

FIGS. 2A-2G are cross-sectional views showing a method of fabricating a package structure 2 according to the present invention.

Figure 1A:
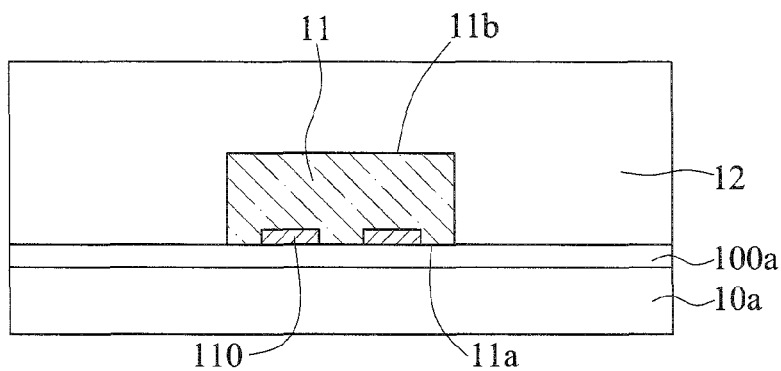
FIGS. 1A-1F are cross-sectional views showing a method of fabricating a conventional semiconductor package.
Figure 1B:
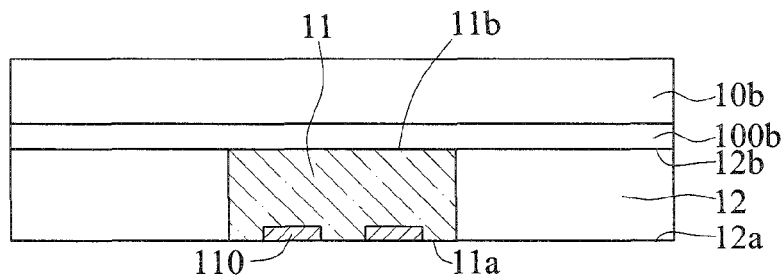
Figure 1C:
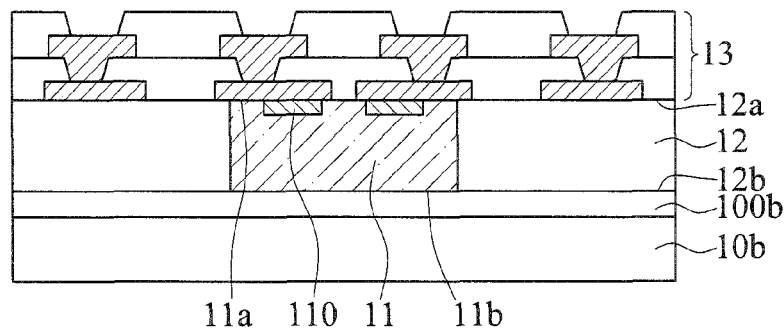
Figure 1D:
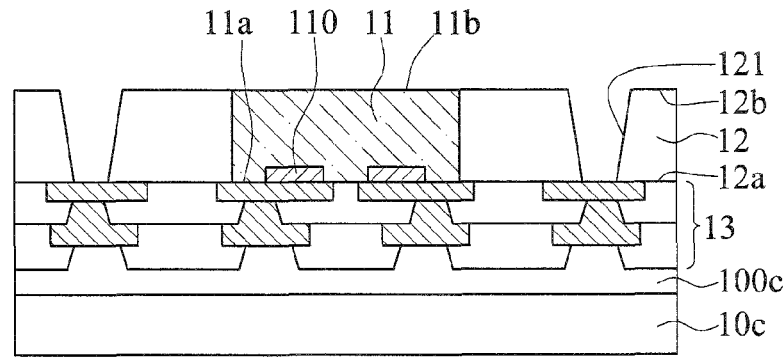
Figure 1E:
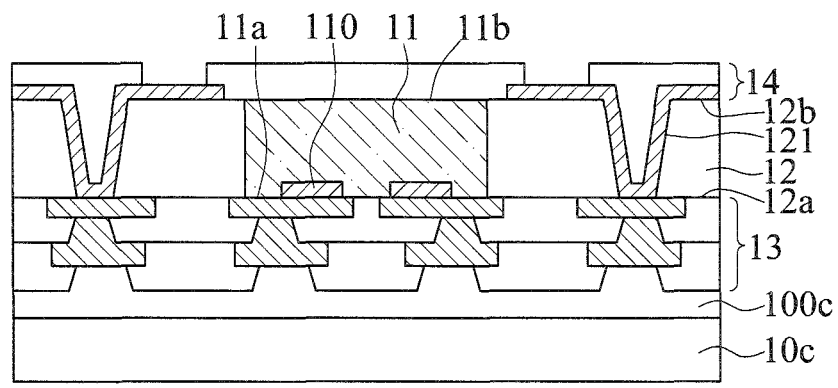
Figure 1F:
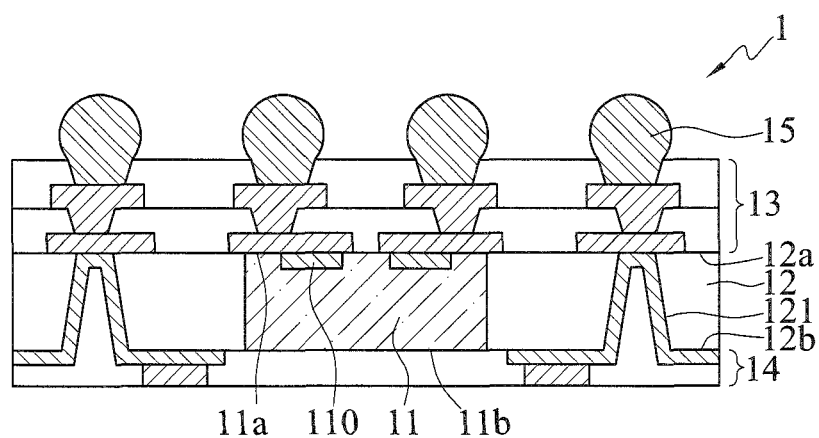
Figure 2A:
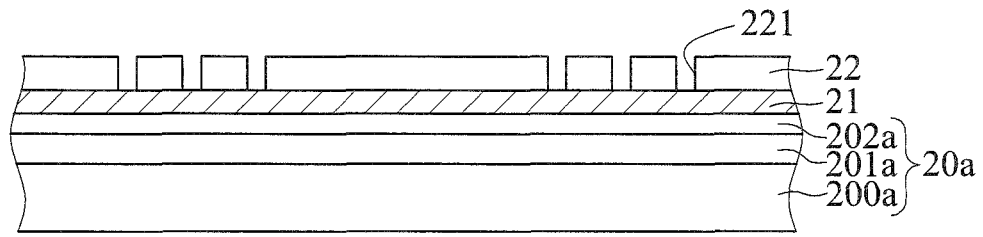
FIGS. 2A-2I are cross-sectional views showing a method of fabricating a package structure according to the present invention; wherein FIG. 2D' is another aspect of FIG. 2D.

As shown in FIG. 2A, a first carrier 20a is provided. The first carrier 20a includes a first board 200a, a first releasing layer 201a and a first adhesive layer 202a. The first board 200a is made of, but not limited to, a semiconductor material, dielectric material, ceramic material, glass or metal material.

The first releasing layer 201a can be a releasing film. The first adhesive layer 202a can be made of an adhesive material. The first releasing layer 201a and the first adhesive layer 202a can be respectively formed on the first board 200a in a sequential order via a coating or an attachment method.

A metal layer 21 is formed on the first adhesive layer 202a of the first carrier 20a. The metal layer 21 may be made of copper and formed by a lamination method, which will serve as a conductive pathway for the latter electroplating process.

After that, a patterned dielectric layer 22 is formed on the metal layer 21. The dielectric layer 22 has a plurality of openings 221 for exposing the metal layer 21. The patterned dielectric layer 22 is formed by an exposure and development method, and the dielectric layer 22 is made of photosensitive material such as polybenzoxazole (PBO).

Figure 2B:
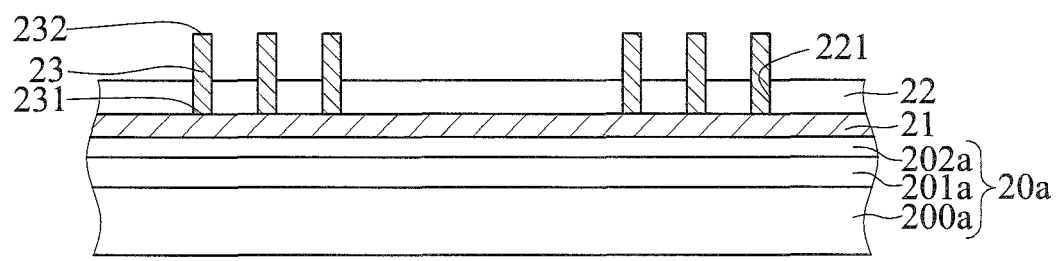

As shown in FIG. 2B, a plurality of conductive pillars 23 are formed in the plurality of openings 221 of the metal layer 21, and each of the conductive pillars 23 has a first end 231 and an opposing second end 232. Each of the conductive pillars 23 can be formed on the patterned dielectric layer 22 by an electroplating plating method through forming a patterned resist layer (not shown) and a seed layer (not shown).

In an embodiment, the first end 231 of each of the conductive pillars 23 is electrically connected with the metal layer 21, and the second end 232 of each of the conductive pillars 23 protrudes from a surface of dielectric layer 22; that is, each of the conductive pillars 23 is vertically mounted on the metal layer 21.

Figure 2C:
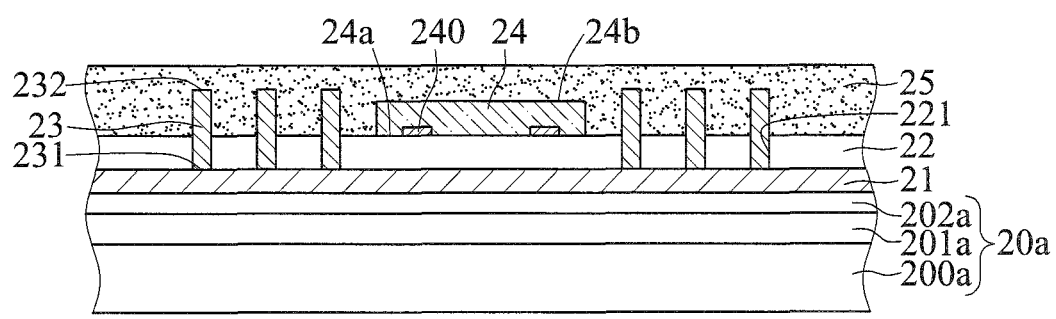

As shown in FIG. 2C, at least one electronic component 24 is disposed on the dielectric layer 22. The electronic component 24 has an active surface 24a and an opposing non-active surface 24b. The active surface 24a is coupled with the dielectric layer 22 and has a plurality of electrode pads 240 thereon.

Subsequently, an encapsulating layer 25 is formed on the dielectric layer 22, that covers each of the conductive pillars 23, the electronic component 24 and the dielectric layer 22. The encapsulating layer 25 is made of an encapsulating material, and is formed selectively by using liquid compound, injection, lamination or compression molding.

Further, the encapsulating layer 25 covers the non-active surface 24b of the electronic component 24, and covers the second end 232 of each of the conductive pillars 23.

Figure 2D:
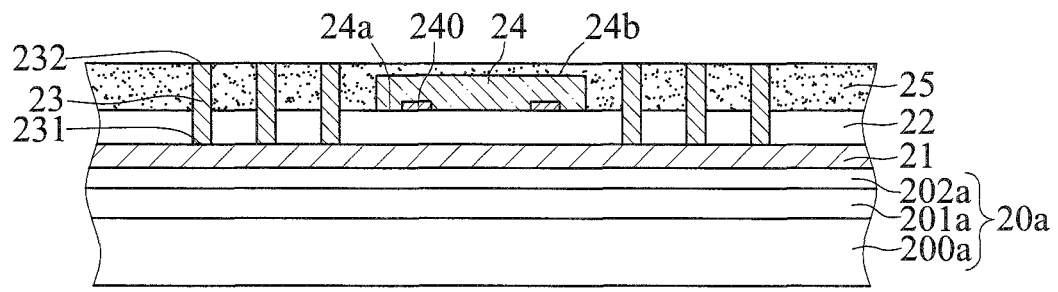
Figure 2D:
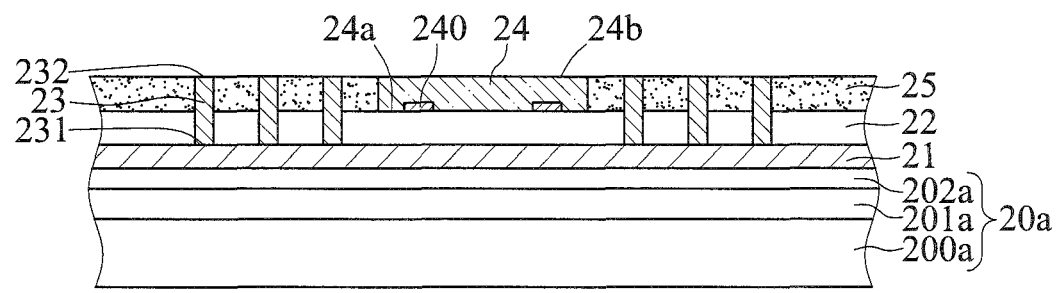

As shown in FIG. 2D, a chemical mechanical polishing (CMP) method for instance is employed to remove a portion of the encapsulating layer 25, until the second end 232 of each of the conductive pillars 23 is exposed therefrom. In an embodiment, the non-active surface 24b of the electronic component 24 is still covered by the encapsulating layer 25 thereon.

In an embodiment, referring to FIG. 2D', a portion of the encapsulating layer 25 can be removed by a polishing method, until both the second end 232 of each of the conductive pillars 23 and the non-active surface 24b of the electronic component 24 are exposed at the same time.

Figure 2E:
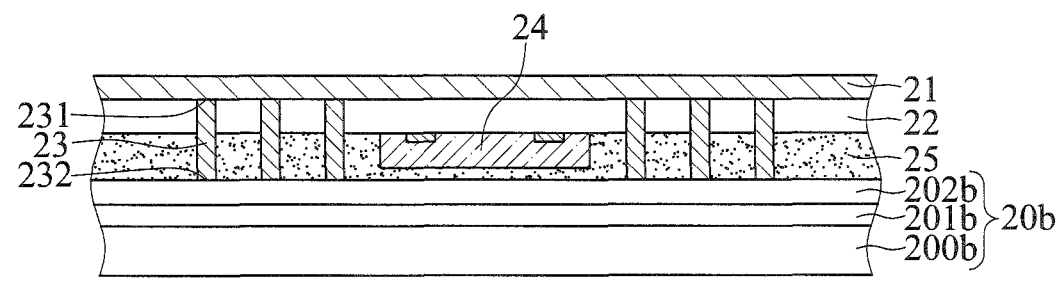

Proceeding with FIG. 2D, a second carrier 20b is formed on the encapsulating layer 25 and bonded with the second end 232 of each of the conductive pillars 23, then the first carrier 20a is removed, as shown in FIG. 2E.

In an embodiment, the second carrier 20b comprises a second board 200b, a second releasing layer 201b and a second adhesive layer 202b. The second board 200b, second releasing layer 201b and second adhesive layer 202b are the same as the previously described first board 200a, first releasing layer 201a and first adhesive layer 202a, therefore will not be described herein.

Figure 2F:
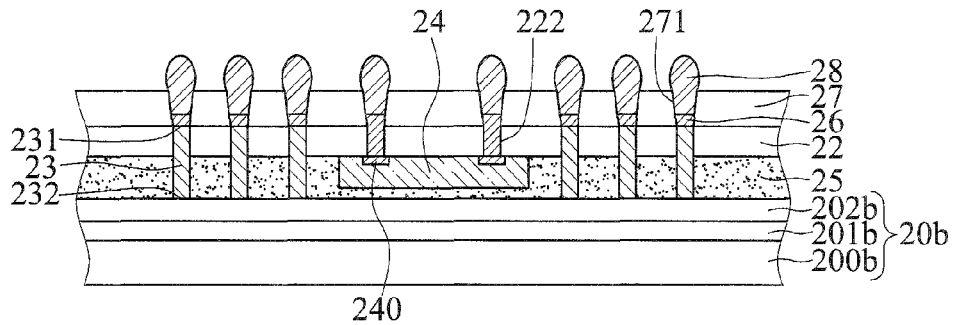

As shown in FIG. 2F, a redistribution layer 26 is formed on the dielectric layer 22. In an embodiment, the metal layer 21 is firstly formed, after that, a plurality of conductive vias 222 are formed in the dielectric layer 22 via an exposure and development process. Subsequently, a redistribution layer 26 is formed on the plurality of conductive vias 222 and the dielectric layer 22 by an electroplating process, as well as a solder mask layer 27 on the dielectric layer 22.

In an embodiment, the method to form the redistribution layer 26 by which the metal layer 21 could be left on without being removed is achieved by forming a partnered resist layer (not shown) on the metal layer 21, followed by etching the metal layer 21. Then, a solder mask layer 27 is formed on the dielectric layer 2.

The solder mask layer 27 is formed with a plurality of openings 271 for exposing the redistribution layer 26, allowing a plurality of conductive elements 28 such as solder balls to be mounted therein. The redistribution layer 26 is electrically connected with the first end 231 of each of the conductive pillars 23 and the electrode pads 240 of the electronic component 24.

Figure 2G:
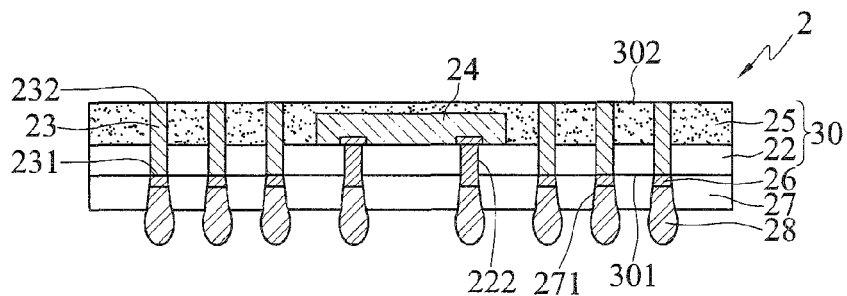

As shown in FIG. 2G, the second carrier 20b is removed, followed by performing a singulation process so as to obtain the package structure 2 of the present invention.

According to the fabricating method of the present invention, the conductive pillars 23 are formed in the openings 221 of the dielectric layer 22, followed by forming the encapsulating layer 25, such that the conductive pillars 23 penetrate both the top and bottom surfaces of the dielectric layer 22 and the encapsulating layer 25. Therefore, the present invention requires no need of using a laser method to form vias. Processes such as alignment for laser drilling, cleaning vias and forming electroplating material in the vias in the prior art can be all omitted. Accordingly, the method of the present invention not only reduces the number of steps and cost involved in the fabrication, the problem of peeling of conductive pillars as a result of uneven surface of the vias wall is prevented, thereby desirably increasing the reliability of the package structure 2.

Further, since no laser drilling process is performed, there will be no Heat Affect Zone, thereby preventing the electronic component 24 from being damaged by the heat generated during laser drilling. Besides, the positions of the conductive pillars 23 can be designed according to practical uses, allowing the distance between the conductive pillars 23 and the electronic component 24 be further reduced, such that the package structure 2 can be made smaller, thereby meeting the low-profile requirement for the products.

Further, as the process of forming openings is omitted, the process of bonding/removing carrier (i.e. the first and second carriers 20a, 20b) only requires to be repeated twice. As compared to the prior art, the present invention is capable of effectively reducing the number of steps for bonding/removing the carrier, and thereby simplifying the fabricating process and reducing the fabricating cost.

A package structure 2 according to the present invention has a dielectric layer 22, an encapsulating layer 25, a plurality of conductive pillars 23, at least one electronic component 24 and a redistribution layer 26.

The encapsulating layer 25 is formed on the dielectric layer 22, and the dielectric layer 22 and the encapsulating layer 25 forms an encapsulant body 30 having a first surface 301 and an opposing second surface 302, wherein the first surface 301 is the outer surface of the dielectric layer 22, while the second surface 302 is the outer surface of the encapsulating layer 25.

The conductive pillars 23 are vertically embedded in the encapsulating layer 25 and the dielectric layer 22. Each of the conductive pillars 23 has a first end 231 being exposed from the first surface 301 and an opposing second end 232 being exposed from the second surface 302. In other words, the first end 231 and the second end 232 penetrate the outer side surfaces of the dielectric layer 22 and the encapsulating layer 25, respectively.

The electronic component 24 is disposed on the dielectric layer 22 and embedded in the encapsulating layer 25. The electronic component 24 has an active surface 24a and an opposing non-active surface 24b. The active surface 24a is coupled with the dielectric layer 22, and has a plurality of electrode pads 240 thereon.

In an embodiment, the first end 231 of each of the conductive pillars 23 is flush with the first surface 301 and the second end 232 of each of the conductive pillars 23 is flush with the second surface 302.

The dielectric layer 22 has conductive vias 222. The redistribution layer 26 is formed on the first surface 301 of the encapsulant body 30 and in the conductive vias 222, for electrically connecting with the first end 231 of each of the conductive pillars 23 and the electrode pads 240 on the active surface 24a of the electronic component 24.

In an embodiment, the package structure 2 further has a solder mask layer 27 formed on the first surface 301 of the encapsulant body 30 and having a plurality of openings 271 exposing the redistribution layer 26, for enabling a plurality of conductive elements 28 such as solder balls to be mounted thereon. The conductive elements 28 are electrically connected with the corresponding conductive pillars 23 and the electronic component 24 via the redistribution layer 26.

In an embodiment, the non-active surface 24b of the electronic component 24 is still covered by the encapsulating layer 25 without exposing the second surface 302.

In another embodiment, the non-active surface 24b of the electronic component 24 is exposed from the second surface 302, so as to form a package structure of another aspect.

Figure 2H:
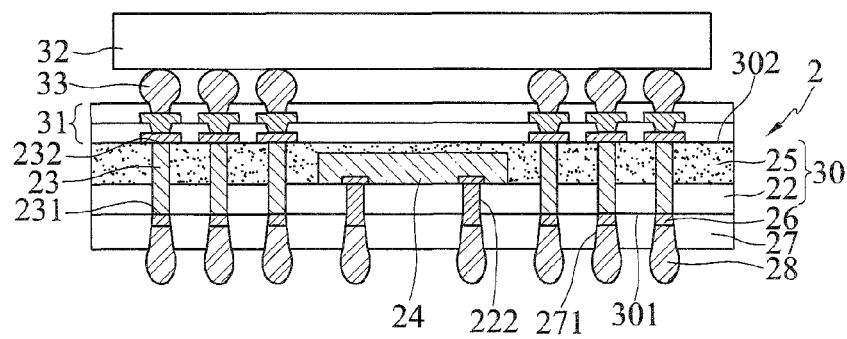

In an embodiment, following FIG. 2G, as shown in FIG. 2H, after the package structure 2 of the present invention is obtained, a redistribution layer (RDL) 31 is formed on the second surface 302 of the encapsulant body 30, and the redistribution layer 31 is electrically connected with the second end 232 of each of the conductive pillars 23. After that, an electronic component 32 is stacked on the second surface 302 of the encapsulant body 30 and electrically connected with the redistribution layer 31 via conductive elements 33 such as solder bumps, copper bumps and so on. The electronic component 32 can be an encapsulant body, a chip or a substrate, but is not limited thereto.

Figure 2I:
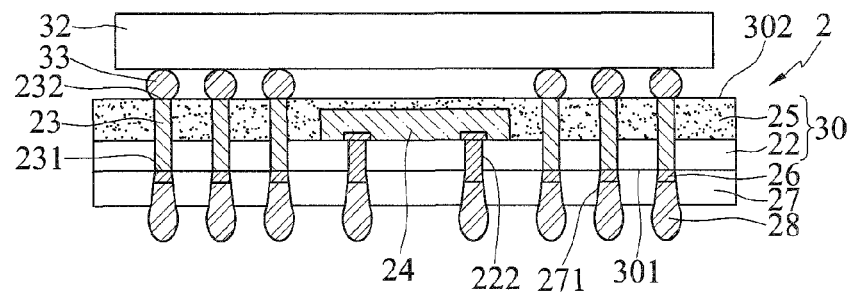

In another embodiment, following FIG. 2G, as shown in FIG. 2I, after the package structure 2 of the present invention is obtained, an electronic component 32 can be directly stacked on the second surface 302 of the encapsulant body 30 and electrically connected with the second end 232 of each of the conductive pillars 23 via conductive elements 33 such as solder bumps, copper bumps and so on.

In summary, the package structure according to the present invention and the method of fabricating the same, involves forming conductive pillars in the dielectric layer in advance of forming an encapsulating layer. Therefore, it eliminates the need of forming openings such that not only the number of steps involved in the fabricating process is reduced but also the fabricating process is time-saving and cost-effective, with increased reliability of the package structure and reduced package size as desired.

Besides, without employing procedures to form openings, the number of steps for bonding/removing carrier is reduced, and additional laser process is also not required, thereby preventing the occurrence of heat affect area, such that it is not required to have laser alignment equipment. Furthermore, the present invention provides a solution to prevent the problem of peeling of the conductive pillars from occurrence, such that the fabricating process is made simplified with reduced cost.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a package structure, comprising:
   providing a first carrier having a metal layer;
   forming a patterned dielectric layer on the metal layer, and forming a plurality of openings for exposing the metal layer in the patterned dielectric layer;
   forming a plurality of conductive pillars having opposing first and second ends in the openings, wherein each of the conductive pillars is electrically connected with the metal layer via the first end thereof and the second end of each of the conductive pillars protrudes from a surface of the dielectric layer;
   disposing at least one first electronic component on the dielectric layer;
   forming an encapsulating layer on the dielectric layer, allowing the encapsulating layer to encapsulate the conductive pillars, the first electronic component and the dielectric layer and to be free from exposing the second end of each of the conductive pillars;
   removing a portion of the encapsulating layer, for exposing the second end of each of the conductive pillars; and
   removing the first carrier.

2. The method of claim 1, further comprising disposing a second carrier on the encapsulating layer prior to removing the first carrier.

3. The method of claim 2, further comprising removing the metal layer, followed by forming a first redistribution layer on the dielectric layer after removing the first carrier, wherein the first redistribution layer is electrically connected to the first end of each of the conductive pillars and the first electronic component.

4. The method of claim 3, further comprising removing the second carrier after the first redistribution layer is formed.

5. The method of claim 4, further comprising forming a second redistribution layer on the encapsulating layer after removing the second carrier, wherein the second redistribution layer is electrically connected to the second end of each of the conductive pillars.

6. The method of claim 5, further comprising stacking a second electronic component on the second redistribution layer, wherein the second electronic component is electrically connected with the second redistribution layer.

7. The method of claim 4, further comprising stacking a second electronic component on the encapsulating layer after removing the second carrier, wherein the second electronic component is electrically connected with the second end of each of the conductive pillars.

8. The method of claim 2, further comprising forming a redistribution layer by etching the metal layer after removing the first carrier, wherein the redistribution layer is electrically connected to the first end of each of the conductive pillars and the electronic component.

9. The method of claim 1, further comprising performing a singulation process after the second carrier is removed.

10. The method of claim 1, wherein the portion of the encapsulating layer is removed by polishing.

11. The method of claim 1, wherein the step of removing a portion of the encapsulating layer is performed to the extent that the electronic component is free from being exposed from the encapsulating layer.

12. The method of claim 1, wherein the step of removing a portion of the encapsulating layer is performed with the second end of each of the conductive pillars and the electronic component are exposed from a remaining portion of the encapsulating layer.

* * * * *